(12) United States Patent
Polak et al.

(10) Patent No.: US 12,130,349 B2
(45) Date of Patent: Oct. 29, 2024

(54) METHOD FOR RECONSTRUCTING A MOTION-CORRECTED MAGNETIC RESONANCE IMAGE OF A SUBJECT

(71) Applicants: Siemens Healthcare GmbH, Erlangen (DE); The General Hospital Corporation, Boston, MA (US)

(72) Inventors: Daniel Polak, Erlangen (DE); Stephen Farman Cauley, Somerville, MA (US); Daniel Nicolas Splitthoff, Uttenreuth (DE)

(73) Assignees: Siemens Healthineers AG, Forchheim (DE); The General Hospital Corporation, Boston, MA (US)

( * ) Notice: Subject to any disclaimer, the term of this patent is extended or adjusted under 35 U.S.C. 154(b) by 79 days.

(21) Appl. No.: 17/990,895

(22) Filed: Nov. 21, 2022

(65) Prior Publication Data

US 2023/0160989 A1    May 25, 2023

(30) Foreign Application Priority Data

Nov. 25, 2021    (EP) .................................... 21210483

(51) Int. Cl.
  *G01R 33/565*   (2006.01)
  *G01R 33/48*    (2006.01)
  *G01R 33/56*    (2006.01)

(52) U.S. Cl.
  CPC ... *G01R 33/56509* (2013.01); *G01R 33/4818* (2013.01); *G01R 33/5608* (2013.01)

(58) Field of Classification Search
  CPC .......... G01R 33/56509; G01R 33/4818; G01R 33/5608; G01R 33/5611
  See application file for complete search history.

(56) References Cited

U.S. PATENT DOCUMENTS

| 11,480,640 B1 | 10/2022 | Polak et al. |
| 2008/0169808 A1 | 7/2008 | Taniguchi et al. |
| 2014/0219531 A1 | 8/2014 | Epstein et al. |

(Continued)

FOREIGN PATENT DOCUMENTS

EP    4071494 A1    10/2022

OTHER PUBLICATIONS

Cordero-Grande, Lucilio, et al. "Sensitivity encoding for aligned multishot magnetic resonance reconstruction." IEEE Transactions on Computational Imaging 2.3 (2016): 266-280.

(Continued)

*Primary Examiner* — G. M. A Hyder
(74) *Attorney, Agent, or Firm* — Lempia Summerfield Katz LLC

(57) ABSTRACT

A method for reconstructing a motion-corrected magnetic resonance image of a subject includes providing k-space magnetic resonance data including a plurality of shots, wherein each shot corresponds to an individual motion state of the subject. The method further includes providing motion parameters related to each motion state, determining redundancies across the motion states of the plurality of shots based on the motion parameters, compressing the plurality of motion states based on the determined redundancies across the motion states, and reconstructing the magnetic resonance image from the k-space magnetic resonance data based on the compressed plurality of motion states.

16 Claims, 4 Drawing Sheets

101 Provide k-space MR data
102 Provide motion parameters
103 Determine redundancies
104 Compress motion states
105 Reconstruct MR image

(56) References Cited

U.S. PATENT DOCUMENTS

2017/0199263 A1* 7/2017 Nickel ............. G01R 33/56509
2021/0373105 A1 12/2021 Polak et al.
2022/0326330 A1 10/2022 Polak et al.

OTHER PUBLICATIONS

Haskell, Melissa W., Stephen F. Cauley, and Lawrence L. Wald. "TArgeted Motion Estimation and Reduction (TAMER): data consistency based motion mitigation for MRI using a reduced model joint optimization." IEEE transactions on medical imaging 37.5 (2018): 1253-1265.

Polak, Daniel, et al. "Scout acquisition enables rapid motion estimation (SAME) for retrospective motion mitigation." 28th Annual Meeting of the International Society of Magnetic Resonance in Medicine. 2020. pp. 1-9.

Pruessmann, Klaas P., et al. "SENSE: sensitivity encoding for fast MRI." Magnetic Resonance in Medicine: An Official Journal of the International Society for Magnetic Resonance in Medicine 42.5 (1999): 952-962.

* cited by examiner

101 Provide k-space MR data
102 Provide motion parameters
103 Determine redundancies
104 Compress motion states
105 Reconstruct MR image 201 Provide k-space MR data
202 Provide low-resolution MR reference image
203 Provide motion parameters
204 Compute motion images
205 Determine singular values and compression matrix
206 Truncate compression matrix
207 Reconstruct MR image 10 Data processing device
11 Interface
12 Processing unit

METHOD FOR RECONSTRUCTING A MOTION-CORRECTED MAGNETIC RESONANCE IMAGE OF A SUBJECT

The present patent document claims the benefit of European Patent Application No. 21210483.0, filed Nov. 25, 2021, which is hereby incorporated by reference in its entirety.

TECHNICAL FIELD

The disclosure relates to a method for reconstructing a motion-corrected magnetic resonance image of a subject, a computer program, a computer-readable medium, and a data processing device.

BACKGROUND

In magnetic resonance imaging (MRI), patient motion is one of the most common and costly types of artifacts that may degrade the diagnostic quality of magnetic resonance (MR) exams. A large variety of MRI motion correction techniques exist such as tracking devices and navigators, but these techniques tend to exhibit problems such as workflow complications (e.g., in the case of tracking devices) or acquisition disruptions (e.g., in the case of navigators). Retrospective methods correct for motion artifacts after the data acquisition without disruptions to the sequence timing or inclusion of additional hardware. By including motion operations into the MR forward model, these techniques account for the patient's motion in the final image reconstruction and therefore reduce motion artifacts through improved model agreement. Especially data-driven retrospective correction techniques allow for the motion data to be derived from the acquired multi-channel k-space data itself. This is feasible as the complex sensitivity profiles of multi-channel coil arrays inherently encode the patient position into the acquired k-space data.

Fully retrospective motion correction methods are for example described in M W. Haskell, S. F. Cauley, and L. L. Wald, *"Targeted Motion Estimation and Reduction (TAMER): Data Consistency Based Motion Mitigation for MRJ using a Reduced Model joint Optimization"*, IEEE Trans. Med. Imaging, vol 37, no. 5, pp. 1253-1265, 2018, wherein a motion free image and motion trajectory are jointly estimated by minimizing the data consistency error of a SENSE forward model including rigid-body subject motion, and in L. Cordero-Grande, R. P. A. G. Teixeira, E. J. Hughes, J. Hutter, A. N. Price, and J. V. Hajnal, *"Sensitivity Encoding for Aligned Multishot Magnetic Resonance Reconstruction,"* IEEE Trans. Comput. Imaging, vol. 2, no. 3, pp. 266-280, 2016, wherein use is made of the partial k-space information provided by multiple receiver coils in order to estimate the position of the imaged object throughout the shots that contribute to the image and wherein the estimated motion is incorporated into the reconstruction model in an iterative manner to obtain a motion-free image. The proposed techniques, however, may require estimating hundreds of coupled temporal motion parameters by solving a large non-linear inverse problem. This may be extremely demanding computationally, which has impeded implementation/adoption in clinical settings.

Recently, a Scout accelerated motion estimation and reduction (SAMER) algorithm has been proposed in D. Polak et al., *"Scout accelerated motion estimation and reduction (SAMER)"*, Magn. Reson. Med. 2021; 00:1-16, which drastically reduces the computation cost of the motion estimation by utilizing a very rapid scout acquisition along with a novel sequence reordering scheme. Unfortunately, the final image reconstruction across up to about 100 different motion states still poses a computationally costly linear optimization problem that may require several minutes of reconstruction time using standard clinical computing hardware.

SUMMARY AND DESCRIPTION

It is therefore an object of the disclosure to provide a method for reconstructing a motion-corrected magnetic resonance image that facilitates clinically feasible computation times, e.g., not more than about one minute, for clinical protocols running on standard clinical computing hardware.

The scope of the present disclosure is defined solely by the appended claims and is not affected to any degree by the statements within this summary. The present embodiments may obviate one or more of the drawbacks or limitations in the related art.

According to a first aspect, a method for reconstructing a motion-corrected magnetic resonance image of a subject is provided, including providing k-space magnetic resonance (MR) data having a plurality of shots, wherein each shot corresponds to an individual motion state of the subject. The method may further include providing motion parameters related to each motion state, determining redundancies across the motion states of the plurality of shots based on the motion parameters, compressing the plurality of motion states based on the determined redundancies across the motion states, and reconstructing the magnetic resonance image from the k-space magnetic resonance data based on the compressed plurality of motion states.

A "shot" in this context may refer to a subset of the k-space data, which has been acquired during a certain time period, so that an individual motion state may be assigned to this subset of k-space data. In this context, a "shot" may be as well a sub part of an echo train. One important aspect is that a "shot" contains sequentially acquired k-space data that corresponds to one motion state. The threshold for motion state may be configurable. Accordingly, a "shot" may including the k-space data from one or several echo train(s). Alternatively, a "shot" may refer to the k-space data from a part of an echo train, wherein an echo train may include several spin echoes and/or gradient echoes. For example, a shot may include the k-space data acquired during a part of an acquisition sequence of the 2D or 3D MR image. The shots may be or may have been acquired by an MR imaging apparatus. One k-space line may be acquired during one echo, and there may be 64 to 512 echoes or 128 to 256 echoes in one shot. A shot may include one or several k-space lines which have been acquired successively. The k-space magnetic resonance data may be high-resolution k-space data, for example, having a resolution of between 0.5 and 4 $mm^3$ per voxel. In some examples, the high-resolution k-space data may have an isotropic resolution, for example, 1 $mm^3$ isotropic resolution. The k-space magnetic resonance data may include 20 to 100 shots. The k-space data may be acquired in a multi-shot imaging protocol using a multi-channel coil array. In the imaging protocol, a fraction of the 3D k-space may be acquired in one shot, which may be after a single radio frequency (RF) excitation. Accordingly, the k-space data may be multi-channel k-space data.

The subject may be a human person, in particular a patient, or an animal or part of a human person or animal. Accordingly, motion may not be avoided during an MR imaging. The motion states may be regarded as physical motion states describing a varying position of the subject that may change over time and thus also in between shots. In particular, each motion state may describe the positioning of the subject during an individual shot and echoes from each shot may be assigned to one motion state. The motion states may be related to the motion parameters in that the motion parameters may define and/or mathematically describe the motion states. The motion parameters may include translational and/or rotational components, (e.g., 3 translational and 3 rotational components), if the subject undergoes mainly rigid motion. More complex (e.g., non-rigid) motion may be described using, e.g., motion vector fields. This may be performed for liver or heart imaging as these organs do not move rigidly (as opposed to the head).

Taking into account the motion states during image reconstruction is thus opportune in order to avoid image artefacts, e.g., blurred or distorted images. However, the amount of movement of the subject during an examination may vary, e.g., due to involuntary movements, or motion states may appear repeatedly, in particular periodically, e.g., due to motion related to breathing or a heartbeat. In this sense, redundancies across the motion states may arise when motion states do not change or change only minimally in between shots. Furthermore, redundancies may arise when motion states reappear periodically due to periodic movement of the subject. The method of compressing motion states may therefore accelerate retrospective motion correction by exploiting the redundancies across the motion states in order to compress the plurality of motion states. Compressing the plurality of motion states may include reducing the number of motion states, in particular, by excluding redundant motion states, and/or neglecting redundant, e.g., insignificant and/or small variables, which are determined across the motion states. Advantageously, while the reconstruction time may be decreased substantially with the method, a similar image quality may be retained as obtained from a full reconstruction due to the compressing being based on the determined redundancies. In other words, the computing of the reconstructed image advantageously drops those computing operations which do not significantly contribute to the appearance of the reconstructed image. In clinical settings, this may expediently reduce work-flow disruptions due to long reconstruction and/or wait times.

According to an embodiment, the redundancies across the motion states may be determined by finding similarities between different motion states, and in particular by comparing the motion parameters of different motion states with each other and finding a redundancy if the differences are below a predetermined threshold. The compression of the motion states may include allocating different shots corresponding to similar motion states to a single motion state. Similarities may correspond to similar motion parameters, in particular describing translational (e.g., in mm) and/or rotational (e.g., in degree or "°") movement. The predetermined threshold may be a variable to adjust the level of compression. Accordingly, the threshold may be chosen to be as low as needed in order to achieve a desired accuracy, in particular, with regard to a required model accuracy and/or a level of acceptable occurring artifacts. For example, if very high-quality reconstructions are desired the threshold may be decreased. On the other hand, if very rapid reconstruction is required, the threshold may be increased at the cost of some increase in artifacts. Optionally, a different threshold value may be set for each component and/or for groups of components. In particular, the threshold may be set in relation to a Voxel size of the reconstructed image. The threshold may be 10% to 80%, 20% to 60%, or 30% to 50% of the Voxel size. The Voxel size may be 1 mm in the case of a 3D image or about 0.5 mm in the case of a 2D image. The threshold may be set to be 0.1 mm to 0.8 mm, 0.2 mm to 0.5 mm, or 0.3 mm. Additionally and/or alternatively, comparable values may be chosen for the rotational parameters. For example, the threshold may be set to be 0.1° to 0.8°, 0.2° to 0.5°, or 0.3°. Setting such thresholds may lead to a reconstruction time that may be an order of magnitude faster (for example, up to 13 times faster) than without applying the compression, while the motion error may still be barely noticeable. The threshold may be set automatically, e.g. based on programmed settings and/or a database, and/or a user may be provided with the possibility to adjust and/or input the threshold.

According to an embodiment, compressing the plurality of motion states may include forming groups of motion states, such that each group contains motion states that are similar to each other with respect to their motion parameters, in particular by comparing the motion parameters of different shots, (e.g., all shots), to each other. Grouping may thus be performed based on an estimated physical motion trajectory as defined by the motion parameters. The similarities may be determined by using the above-described threshold. The motion states of each one group may be combined into a single motion state, in particular such that the number of compressed motion states across all groups is lower than the number of original motion states. A new motion state with new motion parameters may be assigned to each group. e.g., by computing the mean motion across the motion states of every group. In this context, recurring motion states, such as caused by alternating and/or periodic movement, may also be combined into a single group.

According to an embodiment, every motion parameter may include at least one component, (e.g., a plurality of components), wherein a group of motion states may be categorized to be similar to each other if all the components of the motion parameter of any one of the group of motion states differ no more than a predetermined threshold value, in particular the predetermined threshold as mentioned above, from the corresponding components of the motion parameter of any other one of the group of two motion states. The components of the motion parameter may be translational and/or rotational components. In the case of 3D image data, and assuming 3D rigid body motion, there may be three translational and/or three rotational components. For 2D image data and again assuming rigid motion, only 3 components are needed, (e.g., two translational components and one rotational component). In another embodiment, which also takes into account non-rigid motion, each motion state may be described by a motion vector field, and, in this case, the components of the motion parameters may be the vectors of the motion vector fields. The proposed compression techniques also work for these types of (non-rigid) motion. For example, a plurality of motion vector fields may be grouped together if all corresponding vectors of the motion vector fields differ no more than a predetermined threshold value. The grouping may be adjusted such that a reconstruction time and a model accuracy is balanced according to the requirements of the corresponding examination.

Categorizing the motion states of the shots may include applying a metric which allows to cluster the motion parameters. For example, one may apply a maximum metric $$\max_k \|\theta_{k,i} - \theta_{k,j}\|$$

to the motion parameters θ of the shots, wherein k denotes the components of the motion parameters, and i and j denote the different shots, and defining groups of shots such that the shots of each group fulfil:

$$\max_k \|\theta_{k,i} - \theta_{k,j}\| \le \varepsilon,$$

wherein ε is the predetermined threshold.

The threshold ε may have the value 0.3 mm or 0.3°. Hence, the grouping and the number of compressed motion states may be determined based on the motion parameters and the predetermined threshold by using a predefined metric. The predefined metric may be used to map $N_{shot}$ original motion states to $N_{shot,comp}$ compressed motion states such that $N_{shot,comp} \le N_{shot}$. The grouping may be performed by an algorithm, which may in particular perform the grouping via the acts: (1.) Define list of shot indices M=[1, 2,3 ... $N_{shot}$], and (2.) While M is not empty: (a.) find all shots S where $$\max_k \|\theta_{k,i} - \theta_{k,j}\| \le \varepsilon$$

and i,j∈M; (b.) define shots S as new group; and (c.) remove shots S from M.

Accordingly, the algorithm results in a set of compressed motion states where the motion error due to the compression is smaller than c. The algorithm may group together motion states with parameters that differ the least among each other. This algorithm may advantageously be relatively simple yet fast enough to group a number of motion states that are in the order of about 50 to 100 motion states. For example, 64 motion states may be grouped into 5 groups of compressed motion states. Alternatively, the grouping may be implemented in a different way, e.g., by a k-means clustering.

According to an embodiment, new common motion parameters may be assigned to each group of similar motion states, wherein the common motion parameters are within the range of the original motion parameters of the motion states of the respective group, wherein the common motion parameters are in particular the mean of the original motion parameters of the motion states of the respective group. In particular, each new motion parameter may be determined by calculating the mean of each of its components across each group of motion states. Advantageously, a larger number $N_{shot}$ of original motion states may thus be compressed into a smaller number $N_{shot,comp}$ of compressed motion states. For each motion state of the original motion states, there may be a compressed motion state which differs no more than the predetermined threshold from the original motion state. Each compressed motion state may include motion parameters determined via the motion parameters of the motion states of one group, in particular, by calculating the mean of the motion parameters of the motion states for each group. The smaller number of compressed motion states may be attributed to the individual shots such that several shots share common compressed motion states. Accordingly, computing during the image reconstruction may be faster due to the lower number of motion states.

According to an embodiment, the magnetic resonance image may be reconstructed by minimizing the data consistency error between the provided k-space data and a forward model described by an encoding operator, wherein the encoding operator includes the motion parameters for each shot, Fourier encoding, and optionally subsampling and coil sensitivities of a multi-channel coil array. Minimizing the data consistency error may be done via a SENSE+motion model, e.g., by solving a standard regularized least squares problem, in particular by finding the minimum of the square according to the equation:

$$[\hat{x}] = \mathrm{argmin}_x \|E_{\hat{\theta}} x - s\|_2^2.$$

wherein $E_{\hat{\theta}}$ is the encoding operator, x is the motion free image, and s represents the k-space data.

These variables may be related via the equation:

$$s_i = E_{\theta_i} x = M_i F \ C \ T_{\theta_i} R_{\theta_i} x$$

wherein multi-channel k-space data $s_i$ for a given shot i may be related to the (3D) image volume x through image rotations $R_i$, image translations $T_i$, coil sensitivity maps C, a Fourier operator F, and an under-sampling mask $M_i$.

This particular approach of image reconstruction is described, for example, in D. Polak et al., "*Scout accelerated motion estimation and reduction (SAMER)*", Magn Reson Med. 2021; 00:1-16 and based on the SENSE forward model that was introduced by K. P. Pruessmann, M. Weiger, M. B. Scheidegger, and P. Boesiger, "SENSE: sensitivity encoding for fast MRI," Magn. Reson. Med., vol. 42, no. 5, pp. 952-962, 1999. Accordingly, the method, namely the compression of motion states, may be combined with the SAMER approach. This may be particularly advantageous, because the SAMER approach may be also used to provide the motion parameters, which may be used for the compression. Advantageously, due to reducing the number of motion states, calculation via this model may be a lot faster, than when calculating the image reconstruction for all original motion states.

According to a further embodiment, a magnetic resonance reference image (e.g., a low-resolution image) of the subject is provided, wherein determining redundancies is based on the reference image and the motion parameters. The reference image may be a scout scan and/or the reference image may be provided by an MR imaging apparatus. Advantageously, the reference image may be reused from a previous determination of the motion parameters. For example, the SAMER approach described by Polak et al. also uses a reference scan. However, the method may also be combined with other sources for motion parameters, e.g., navigators and/or camera systems. It is conceivable to acquire a reference image for the method, in particular if no scout scan is available from the motion parameter determination. The low-resolution reference image may have a spatial resolution in a range of 2-8 mm, in a range of 3-5 mm, or 4 mm in the phase encode plane. The reference image may be a 3D image, which may be acquired with the same or a different imaging protocol than the (high resolution) magnetic resonance k-space data. The reference image may have a similar or slightly differing contrast to the image data. For example, the reference image may be acquired using parallel imaging accelerations of R=4 to R=12 at low spatial resolution of e. g. 4×4×4 mm³. Advantageously, the reference image may be acquired faster than regular image data, e.g., in 2-6 sec. Furthermore, due to the low resolution, calculation concerning the scout image may be carried out faster than calculations with a high-resolution image.

In an embodiment, motion images may be computed by rotating and/or translating the reference image using the motion parameters to obtain a motion image for each shot, and wherein determining redundancies may be based on the motion images. In case the motion parameters include motion vector fields, the motion images are computed by applying the motion vector fields to the reference image. Accordingly, the motion as determined by the motion parameters may be simulated via the reference image. Thus, a set of reference images in the different motion states may be computed. If the reference image is a low-resolution image, the corresponding calculation may be particularly fast. Furthermore, because the calculation of rotated images is a forward calculation and does not have to involve solving of more complex problems, the computing time may be kept low.

Singular values and a compression matrix may be determined by applying a singular value decomposition (SVD) to the motion images, wherein the compression matrix is truncated after the singular value decomposition. The compression matrix may be the V matrix from the SVD, where some entries have been truncated based on the singular values S. The compression matrix may in particular be a matrix including the singular values as its diagonal elements and zeros otherwise. The singular values may be ordered according to their size and truncating the compression matrix may include disregarding singular values that are below a predetermined threshold. For example, the compression matrix may be truncated from a $N_{shot} \times N_{shot}$ to a $N_{shot} \times N_{shot,comp}$ matrix, wherein $N_{shot,comp} < N_{shot}$. Accordingly, the threshold may be adjusted in order to determine the computation speed which may be inverse to the reconstruction quality, in particular according to the requirements of an examination. Advantageously, truncating the matrix by only disregarding low singular values may increase the computation speed while at the same time having only minor impact on the reconstruction quality.

Truncating the compression matrix may be based on a decay of the singular values. The singular values may have a magnitude that decays according to a decay function. Hence, the decay may be described by a decay constant or decay value and the threshold for truncating the compression matrix may be based on the decay constant or decay value. For example, the singular values may include values that are smaller than 1.0 and any values below 0.1 may be disregarded in order to truncate the compression matrix.

According to an embodiment, the magnetic resonance image may be reconstructed by minimizing the data consistency error between the provided k-space data and a forward model described by an encoding operator, wherein the encoding operator includes the motion parameters for each shot, Fourier encoding, and optionally subsampling and coil sensitivities of a multi-channel coil array, and wherein the encoding operator is modified by the truncated compression matrix. The magnetic resonance image may in particular be reconstructed via a SENSE+motion model which is at least modified by the truncated compression matrix. The image reconstruction may otherwise be carried out corresponding to the unmodified calculation as described above. Minimizing the data consistency error may be carried out according to the minimization of:

$$\min_x \left\| \sum_j \hat{M}_j FC \sum_i V_{ij} T_i R_i x - s \right\|, \text{ where } \hat{M}_j = \sum_i V_{ij} M_i$$

wherein x denotes the image volume and s denotes the k-space data which are related through image rotations $R_i$, image translations $T_i$, coil sensitivity maps C, a Fourier operator F, and an under-sampling mask $M_i$.

The undersampling mask $M_i$ (index i denotes the uncompressed physical motion states/shots) also needs to be transformed into the compressed shot domain. This is achieved by multiplying $M_i$ with $V_{ij}$ and summing across the physical states i to obtain $\hat{M}_j$.

In addition, the rotations $R_i$ and translations $T_i$, are modified via the truncated compression matrix $V_{ij}$. The compression matrix reduces the $N_{shot}$ motion images to $N_{shot,comp}$ compressed images. The Fourier operator F may be computationally demanding. By decreasing the motion images, the computational cost may be reduced accordingly via the application of the compression matrix. Hence the computationally demanding Fourier transformation F needs only to be applied to a reduced number of components according to the truncation of the compression matrix. This may advantageously yield shorter reconstruction times.

According to an embodiment, the motion parameters may be determined via a retrospective motion correction method, via a motion tracking device, e.g., via a motion camera system, and/or via a navigator method. A retrospective motion correction method may be SAMER as described by D. Polak et al. in "*Scout Acquisition enables rapid Motion Estimation (SAME) for fully separable retrospective motion mitigation*," or TAMER as described by M W. Haskell et al. in "*TArgeted Motion Estimation and Reduction (TAMER): Data Consistency Based Motion Mitigation for MRI using a Reduced Model joint Optimization*", IEEE Trans. Med. Imaging, vol 37, no. 5, pp. 1253-1265, 2018. Any method suitable to provide motion parameters may be used. A combination with SAMER may be particularly advantageous because it may provide knowledge about motion parameters, and it may provide a scout scan which may serve as reference image for the embodiment as described above.

According to a further aspect, a computer program including instructions, which, when the program is executed by a data processing device, cause the data processing device to carry out the (acts of the) method as described herein is provided. The data processing device may be a computer, in particular personal computer, and/or a clinical computing hardware. All features and advantages of the method may be configured to the computer program and vice versa.

According to a further aspect, a computer-readable medium having stored thereon the computer program as described above is provided. The computer-readable medium may be a non-transitory computer-readable medium. The computer-readable medium may be any digital storage medium, such as a hard disc, a cloud, an optical medium such as a CD or DVD, a memory card such as a compact flash, memory stick, a USB-stick, multimedia stick, secure digital memory card (SD), etc. All features and advantages of the method and the computer program may be configured to the computer-readable medium and vice versa.

According to a further aspect, a data processing device configured to carry out the method as described herein is provided. The data processing device may include a computer. The computer may be any computer including a sufficiently powerful processing unit, which may be a CPU or GPU, or several such processing units. Accordingly, the computer may be a PC, a server, a console of an MRI apparatus, or a computer that is remote from the MRI apparatus and connected with the MRI apparatus through the internet. Accordingly, the computer may also be a cloud computer, a remote server etc. The computer may also be a mobile device, such as a laptop, tablet computer or mobile phone. The data processing device may further include an interface configured to receive k-space data, in particular multi-channel k-space data, acquired in a multi-shot imaging protocol, in particular using a multi-channel coil array. The data processing device may further or alternatively include a processing unit configured to carry out the computer program as described herein. All features and advantages of the method, the computer program, and the computer-readable medium may be configured to the data processing device and vice versa.

BRIEF DESCRIPTION OF THE DRAWINGS

The accompanying drawings illustrate various example methods and other example embodiments of various aspects.

DETAILED DESCRIPTION

Figure 1:
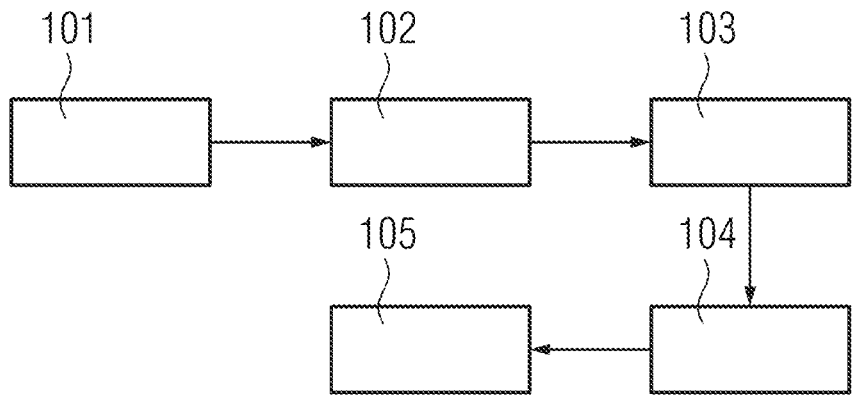
FIG. 1 depicts a flow diagram of a method according to an embodiment.

Similar elements are designated with the same reference signs in the drawings.

FIG. 1 shows a flow diagram of a method for reconstructing a motion-corrected magnetic resonance image of a subject according to an embodiment.

In act 101, k-space magnetic resonance data is provided which has been acquired in a plurality of shots with individual motion states of the examined subject.

In act 102, motion parameters related to each motion state are provided via a retrospective motion correction method.

In act 103, redundancies across the motion states of the plurality of shots are determined by comparing the six rotational and translatory components of the motion parameters of different motion states with each other and finding a redundancy if the differences are below a predetermined threshold, e.g., of 0.3 mm or 0.3°. Therein, motion states are categorized to be similar to each other if all the components of the motion parameter of any one of the motion states differ no more than the predetermined threshold from the corresponding components of the motion parameter of any other one of the group of two motion states.

In act 104, the motion states are compressed based on the determined redundancies by forming groups of motion states such that each group contains motion states that are similar to each other with respect to their motion parameters and such that new common motion parameters are assigned to each group of similar motion states. The common motion parameters are in particular the mean of the original motion parameters of the motion states of the respective group.

In act 105, the magnetic resonance image is reconstructed from the k-space magnetic resonance data based on the compressed motion states. The magnetic resonance image may be reconstructed by minimizing the data consistency error between the provided k-space data and a forward model described by an encoding operator, wherein the encoding operator includes the motion parameters for each shot, Fourier encoding, as well as subsampling and coil sensitivities of a coil array.

Figure 2:
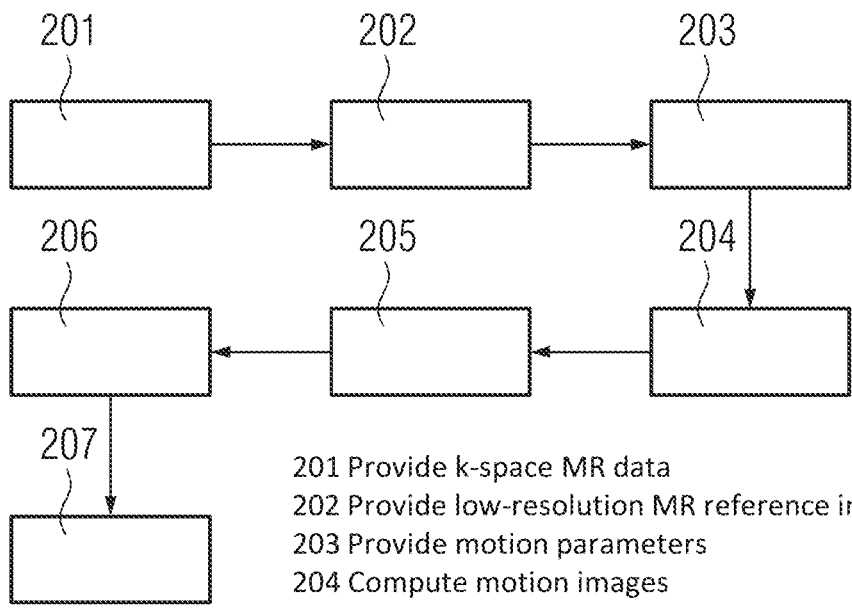
FIG. 2 depicts a flow diagram of a method according to another embodiment.

FIG. 2 shows a flow diagram of a method for reconstructing a motion-corrected magnetic resonance image of a subject according to another embodiment.

In act 201, k-space magnetic resonance data including a plurality of shots is provided. Each shot has been acquired during an individual motion state of the subject.

In act 202, a low-resolution magnetic resonance reference image of the subject is provided.

In act 203, motion parameters related to each motion state are provided by a retrospective motion correction method, in particular by SAMER. For SAMER, the same low-resolution magnetic resonance reference image may be used as for act 204.

In act 204, motion images are computed by rotating and/or translating the reference image using the motion parameters to obtain a motion image for each shot.

In acts 205 and 206, redundancies across the motion states of the plurality of shots are determined based on the reference image and the motion parameters. Therefore, in act 205, singular values and a compression matrix are determined by applying a singular value decomposition to the motion images and, in act 206, the compression matrix is truncated after the singular value decomposition, in particular based on a decay of the singular values, e.g., singular values below a predetermined or automatically determined threshold are neglected.

In act 207, the magnetic resonance image is reconstructed from the k-space magnetic resonance data via a SENSE+ motion model which is modified by the truncated compression matrix.

The method was applied to a standard clinical MPRAGE acquisition with real subject motion and 64 shots.

Figure 3:
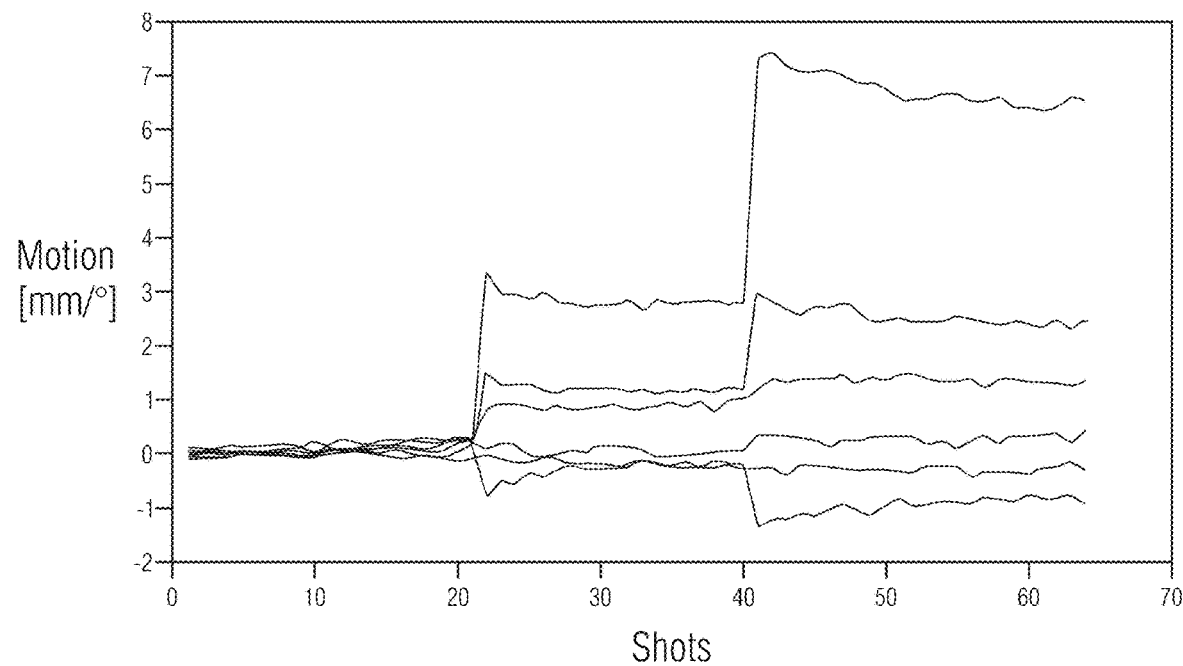
FIG. 3 depicts a plot of uncompressed motion states versus the corresponding shots.

FIG. 3 shows 64 motion states corresponding to the 64 shots (the horizontal axis) and their motion parameters (the vertical axis). The vertical axis shows the motion parameters in mm in the case of translational motion components and in degree (°) in the case of rotational motion components. The different lines represent the different components of the motion parameters. The motion states in FIG. 3 are not compressed, however, some motion states are similar to each other.

Figure 4:
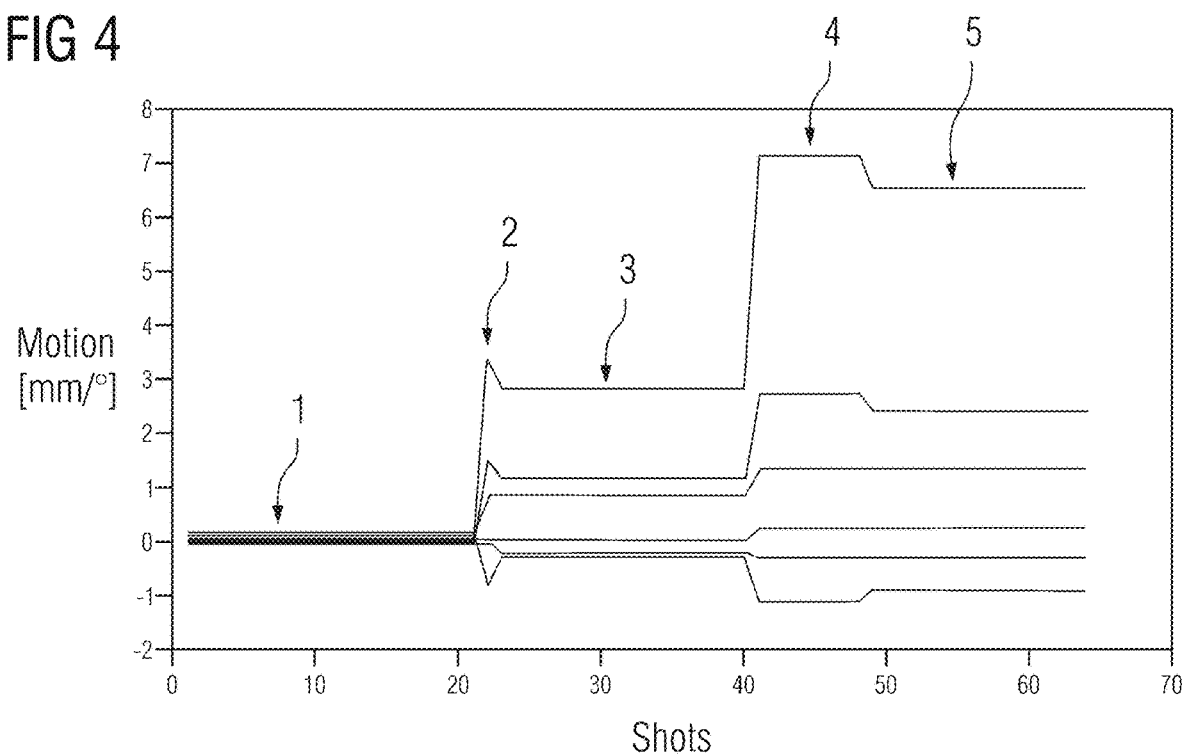
FIG. 4 depicts a plot of compressed motion states versus the corresponding shots.

In FIG. 4, the motion states are grouped into five compressed motion states 1-5 based on their similarity and a predetermined threshold of 0.3 mm or degrees for each component of the motion parameters. Accordingly, every compressed motion state corresponds to several shots, wherein only the second compressed motion state 2 corresponds to only one shot. Due to the compression, the lines of the motion parameters' components appear flatter when compared to the lines in FIG. 3. This resulted in an about 13 times faster image reconstruction while retaining comparable image quality as obtained from a standard reconstruction without compression.

Figure 5:
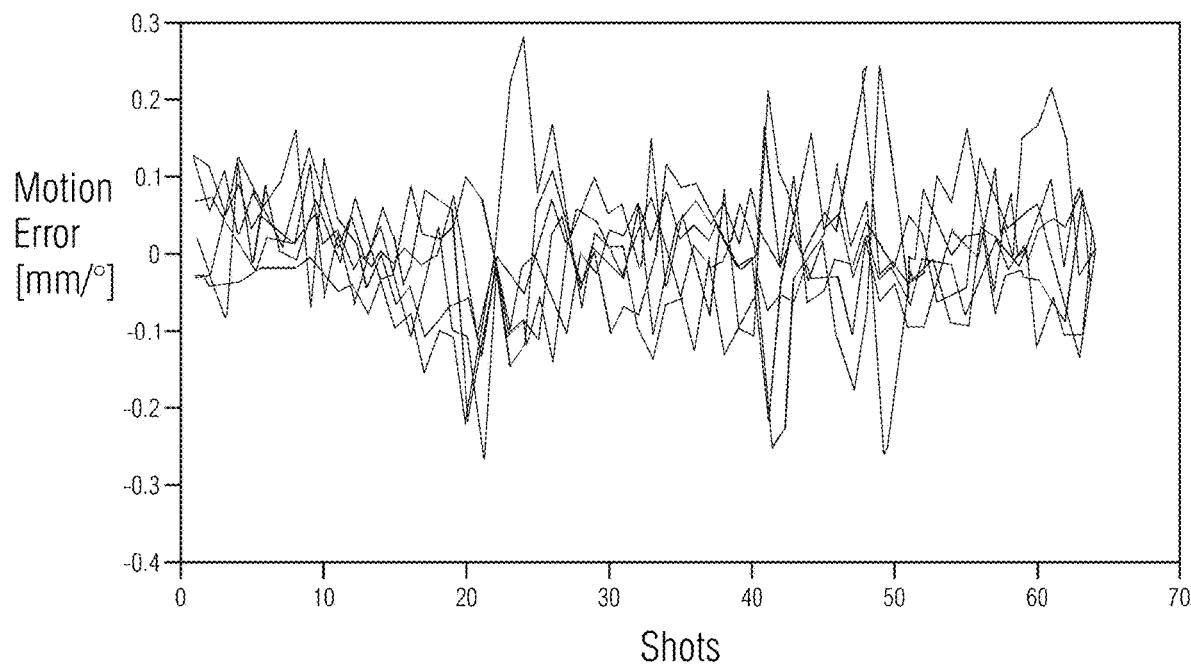
FIG. 5 depicts a plot of the motion error due to the compression shown in FIG. 4.

FIG. 5 shows the absolute motion error for all the states, and it becomes apparent from this figure that, overall, no individual shot has an error that is greater than 0.3 mm or 0.3° for any of its components.

Figure 6:
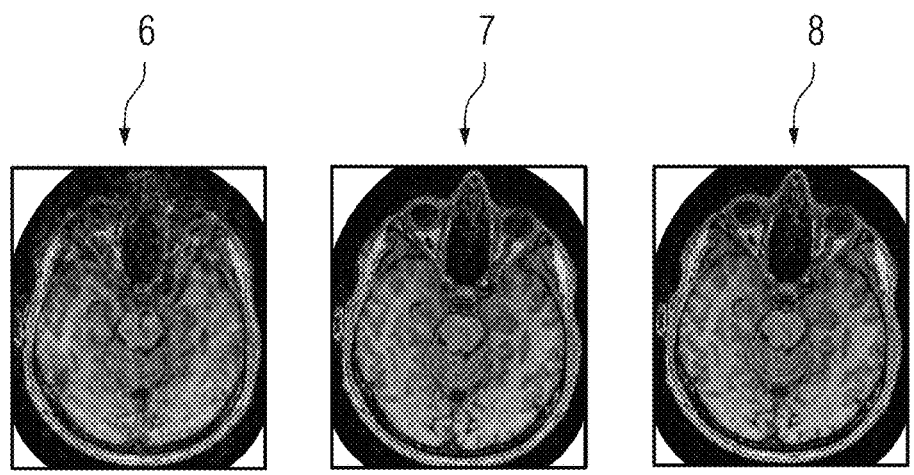
FIG. 6 depicts MR images with and without motion correction.

FIG. 6 shows an MR image without any motion correction 6 in comparison to an MR image where motion was corrected without compressing the motion states 7, (e.g., via a full reconstruction across 64 motion states), and with compressed motion states 8. For these images, the compression method was combined with the SAMER technique which contributed the motion parameters used for the compression. While the image without motion correction 6 shows visible distortions and blur, the corrected images 7 and 8 have a comparable image quality while the reconstruction with compressed motion states allowed to reduce the computational costs of the final image reconstruction by almost 13-fold.

Figure 7:
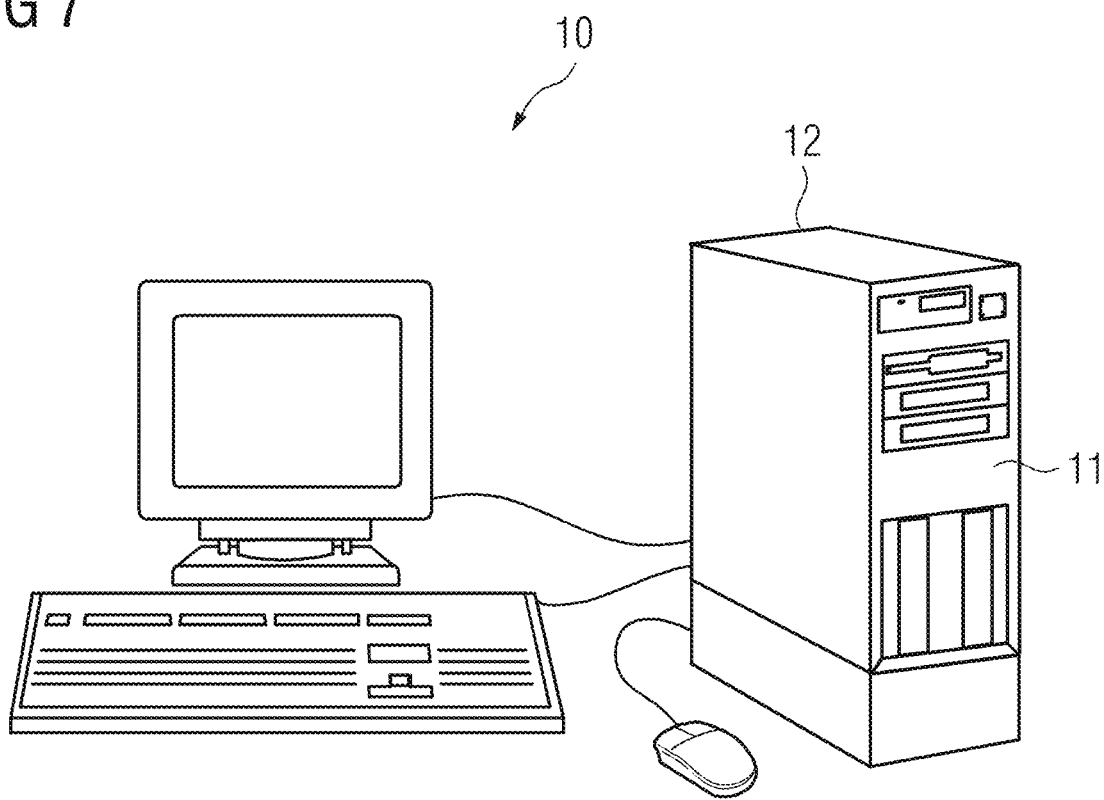
FIG. 7 depicts an example of a data processing device.

FIG. 7 shows a data processing device including an interface 11 configured to receive k-space data and a processing unit 12 configured to carry out method, which is stored as a computer program on a computer-readable medium of the data processing device 10.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for reconstructing a motion-corrected magnetic resonance image of a subject, the method comprising:
providing k-space magnetic resonance data comprising a plurality of shots, wherein each shot of the plurality of shots corresponds to an individual motion state of the subject;
providing motion parameters related to each individual motion state of a plurality of motion states;
determining redundancies across the plurality of motion states of the plurality of shots based on the motion parameters, wherein the redundancies across the plurality of motion states are determined by finding similarities between different motion states, and wherein the finding of the similarities comprises comparing the motion parameters of the different motion states with each other and finding a redundancy when differences between the different motion states are below a predetermined threshold;
compressing the plurality of motion states based on the determined redundancies across the plurality of motion states; and
reconstructing a magnetic resonance image from the k-space magnetic resonance data based on the compressed plurality of motion states.

2. The method of claim 1, wherein the compressing of the plurality of motion states comprises forming groups of motion states such that each group of motion states contains motion states that are similar to each other with respect to the respective motion parameters.

3. The method of claim 2, wherein the forming of the groups of motion states comprises comparing the motion parameters of different shots of the plurality of shots with each other.

4. The method of claim 3, wherein the comparing of the motion parameters comprises comparing all of the shots of the plurality of shots with each other.

5. The method of claim 2, wherein new common motion parameters are assigned to each group of similar motion states,
wherein the new common motion parameters are within a range of original motion parameters of the motion states of a respective group, and
wherein the new common motion parameters are a mean of the original motion parameters of the motion states of the respective group.

6. The method of claim 1, wherein every motion parameter of the motion parameters comprises at a plurality of components, and
wherein a group of motion states are categorized to be similar to each other when every component of the motion parameter of any motion state of the group of motion states differs no more than a predetermined threshold value from corresponding components of the motion parameter of any other motion state of the group of motion states.

7. The method of claim 1, wherein the motion parameters are determined via a retrospective motion correction method, via a motion tracking device, via a navigator method, or a combination thereof.

8. A method for reconstructing a motion-corrected magnetic resonance image of a subject, the method comprising:
providing k-space magnetic resonance data comprising a plurality of shots, wherein each shot of the plurality of shots corresponds to an individual motion state of the subject;
providing motion parameters related to each individual motion state of a plurality of motion states;
determining redundancies across the plurality of motion states of the plurality of shots based on the motion parameters;
compressing the plurality of motion states based on the determined redundancies across the plurality of motion states; and
reconstructing a magnetic resonance image from the k-space magnetic resonance data based on the compressed plurality of motion states,
wherein the magnetic resonance image is reconstructed by minimizing a data consistency error between the provided k-space data and a forward model described by an encoding operator, and
wherein the encoding operator comprises the motion parameters for each shot of the plurality of shots, Fourier encoding, and optionally subsampling and coil sensitivities of a multi-channel coil array.

9. A method for reconstructing a motion-corrected magnetic resonance image of a subject, the method comprising:
providing k-space magnetic resonance data comprising a plurality of shots, wherein each shot of the plurality of shots corresponds to an individual motion state of the subject;
providing motion parameters related to each individual motion state of a plurality of motion states;
providing a magnetic resonance reference image of the subject;
determining redundancies across the plurality of motion states of the plurality of shots based on the magnetic resonance reference image and the motion parameters;
compressing the plurality of motion states based on the determined redundancies across the plurality of motion states; and
reconstructing a magnetic resonance image from the k-space magnetic resonance data based on the compressed plurality of motion states.

10. The method of claim 9, wherein the magnetic resonance reference image is a low-resolution image having a spatial resolution in a range of 2-8 mm in a phase encode plane.

11. The method of claim 9, wherein motion images are computed by rotating and/or translating the magnetic resonance reference image using the motion parameters and/or by applying motion vector fields relating to the motion states, to obtain a motion image for each shot of the plurality of shots, and
wherein the determining of the redundancies is based on the motion images.

12. The method of claim 11, wherein singular values and a compression matrix are determined by applying a singular value decomposition to the motion images from each shot of the plurality of shots,
wherein the compression matrix is a V matrix from the singular value decomposition, and
wherein the compression matrix is truncated after the singular value decomposition.

13. The method of claim 12, wherein the truncating of the compression matrix is based on a decay of the singular values.

14. The method of claim 12, wherein the magnetic resonance image is reconstructed via a SENSE+motion model that is at least modified by the truncated compression matrix.

15. A non-transitory computer program comprising instructions, wherein, when the computer program is executed by a data processing device, the data processing device is configured to:
provide k-space magnetic resonance data comprising a plurality of shots, wherein each shot of the plurality of shots corresponds to an individual motion state of a subject;
provide motion parameters related to each individual motion state of a plurality of motion states;
provide a magnetic resonance reference image of the subject;
determine redundancies across the plurality of motion states of the plurality of shots based on the magnetic resonance reference image and the motion parameters;
compress the plurality of motion states based on the determined redundancies across the plurality of motion states; and
reconstruct a magnetic resonance image from the k-space magnetic resonance data based on the compressed plurality of motion states.

16. A data processing device comprising:
a processor configured to:
provide k-space magnetic resonance data comprising a plurality of shots, wherein each shot of the plurality of shots corresponds to an individual motion state of a subject;
provide motion parameters related to each individual motion state of a plurality of motion states;
provide a magnetic resonance reference image of the subject;
determine redundancies across the plurality of motion states of the plurality of shots based on the magnetic resonance reference image and the motion parameters;
compress the plurality of motion states based on the determined redundancies across the plurality of motion states; and
reconstruct a magnetic resonance image from the k-space magnetic resonance data based on the compressed plurality of motion states.

* * * * *